(12) United States Patent
Maruyama

(10) Patent No.: US 9,691,697 B2
(45) Date of Patent: Jun. 27, 2017

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventor: Rikihiro Maruyama, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/278,655

(22) Filed: Sep. 28, 2016

(65) Prior Publication Data

US 2017/0141022 A1    May 18, 2017

(30) Foreign Application Priority Data

Nov. 16, 2015  (JP) ................. 2015-224140

(51) Int. Cl.
*H01L 23/29* (2006.01)
*H01L 21/48* (2006.01)
*H01L 23/498* (2006.01)
*H01L 23/31* (2006.01)

(52) U.S. Cl.
CPC .... *H01L 23/49838* (2013.01); *H01L 21/4853* (2013.01); *H01L 23/293* (2013.01); *H01L 23/3121* (2013.01)

(58) Field of Classification Search
CPC ....... H01L 23/29; H01L 23/293; H01L 23/31; H01L 23/312; H01L 23/3121; H01L 23/49; H01L 23/498; H01L 23/4983; H01L 23/49838; H01L 21/48; H01L 21/485; H01L 21/4853
USPC ........................................... 257/693
See application file for complete search history.

(56) References Cited

U.S. PATENT DOCUMENTS

2008/0217760 A1    9/2008   Yoshihara et al.

FOREIGN PATENT DOCUMENTS

| JP | 2008-235651 A | 10/2008 |
|---|---|---|
| JP | 2008-252055 A | 10/2008 |

*Primary Examiner* — Monica D Harrison
(74) *Attorney, Agent, or Firm* — Rabin & Berdo, P.C.

(57) ABSTRACT

A terminal pressing frame of a semiconductor device is disposed so as to form a first gap partially from the bottom surface of an L-shaped leg portion of an external terminal and a second gap from an inside surface of a resin case. Adhesive spreads to the second gap and further spreads to the first gap connected to the second gap, consequent to the pressure when a metal base is assembled. The spreading of the adhesive to the first gap fixes an L-shaped leg portion of the external terminal and the terminal pressing frame to each other; and the spreading of adhesive to the second gap fixes the resin case and the terminal pressing frame to each other.

7 Claims, 8 Drawing Sheets

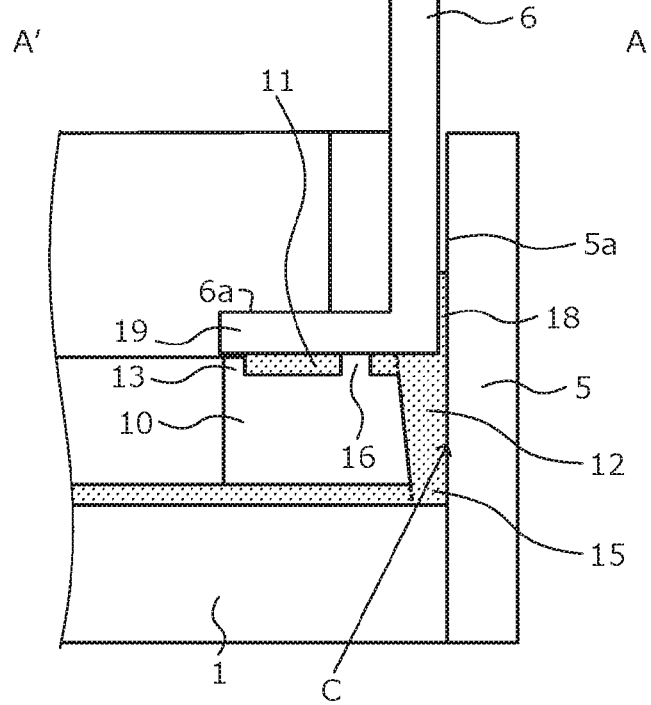
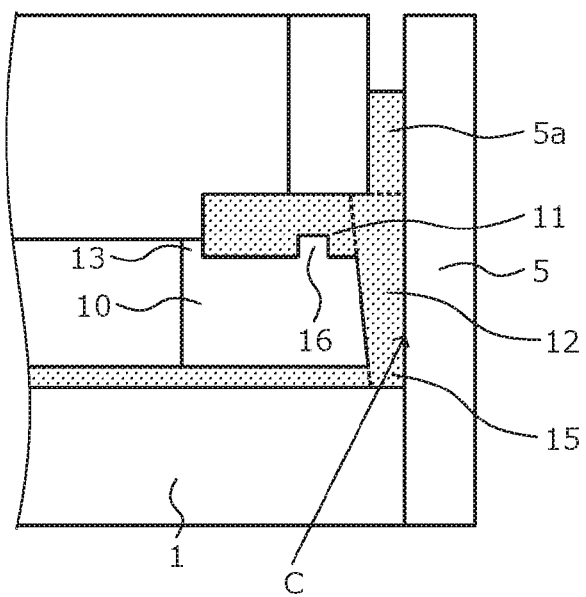

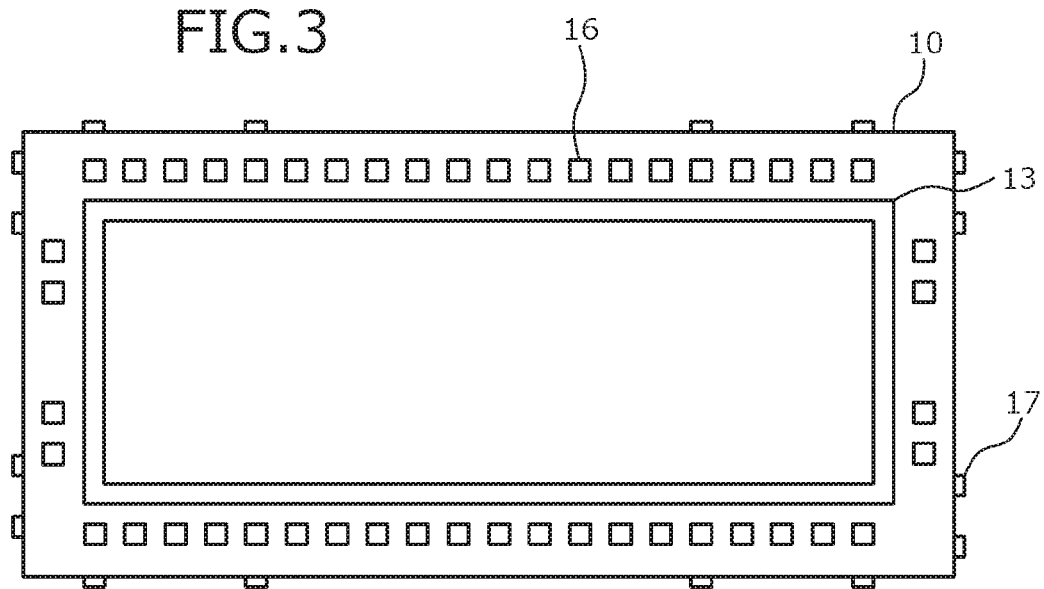

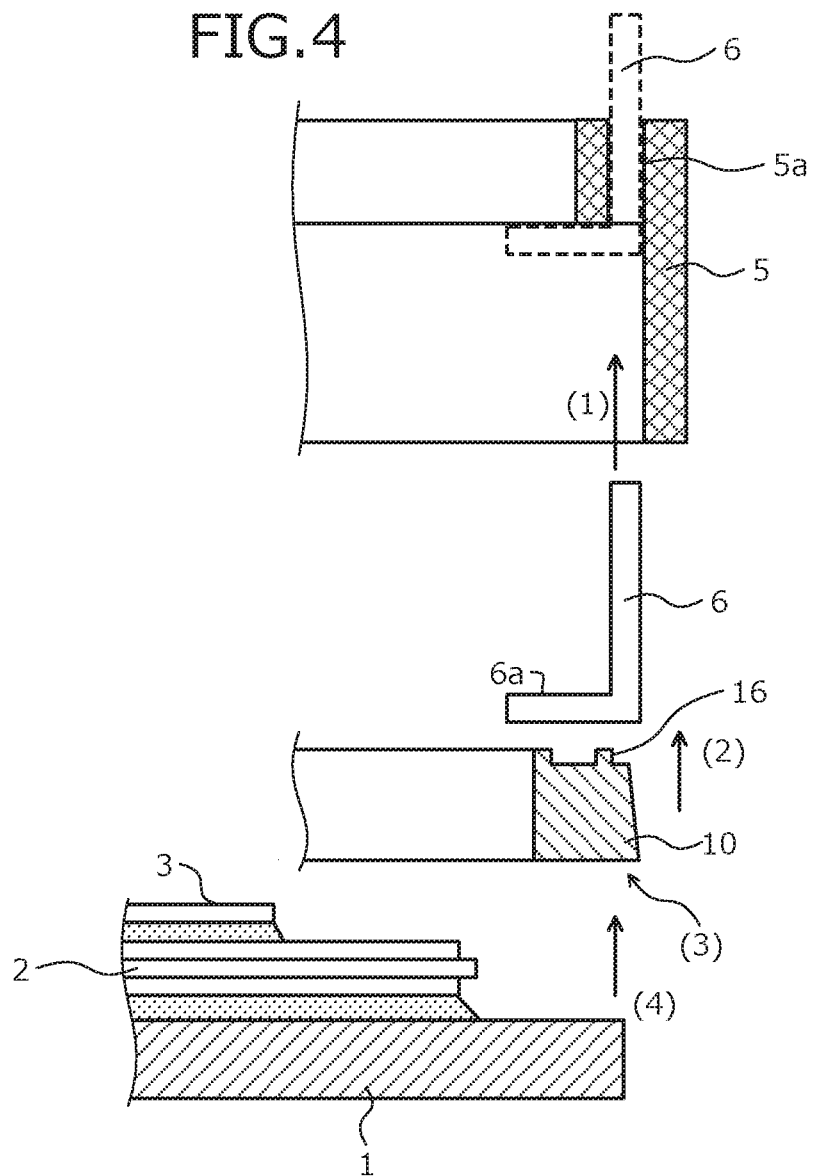

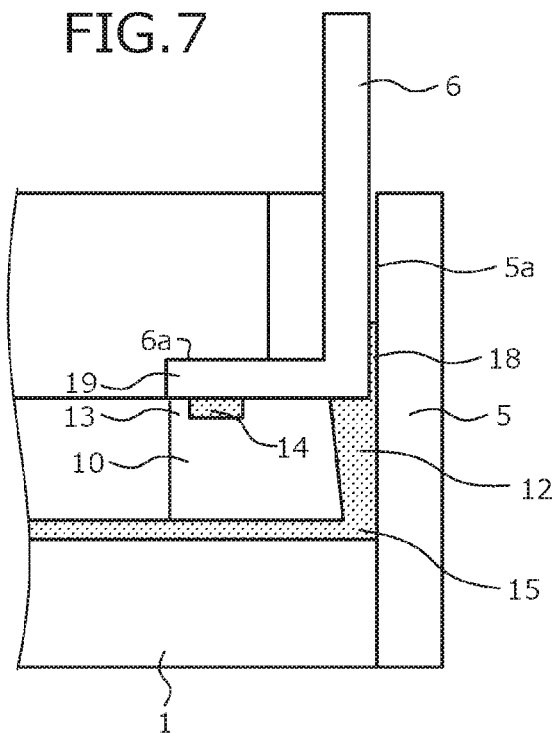

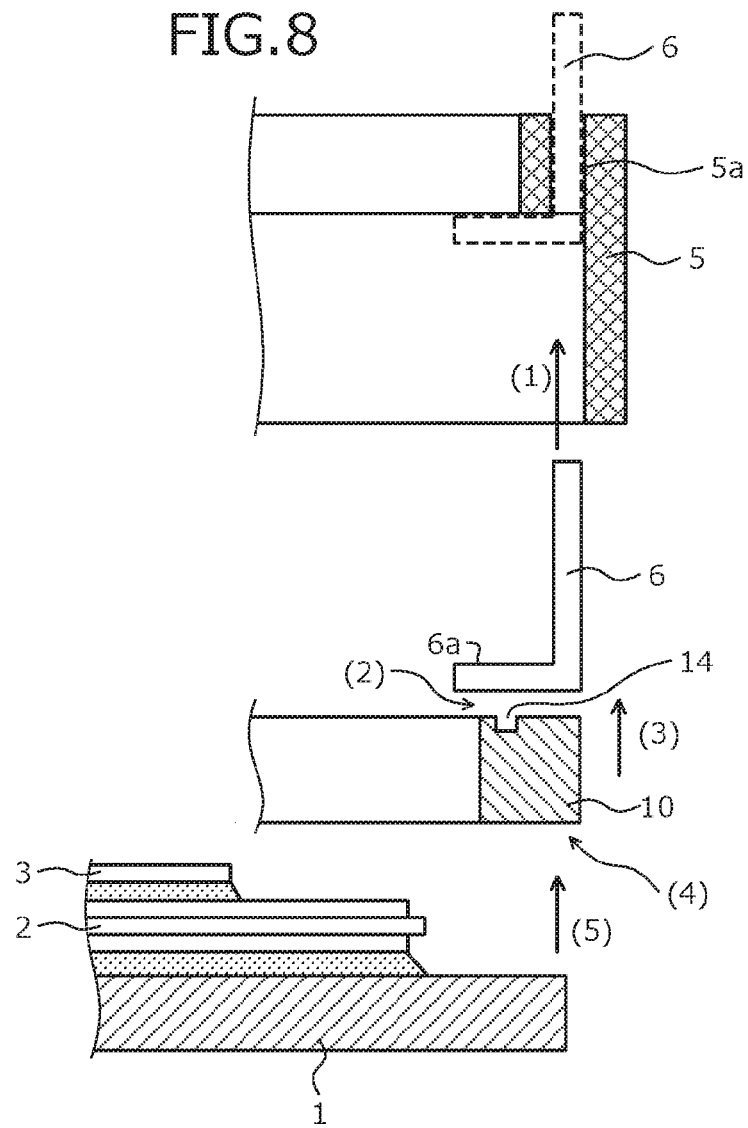
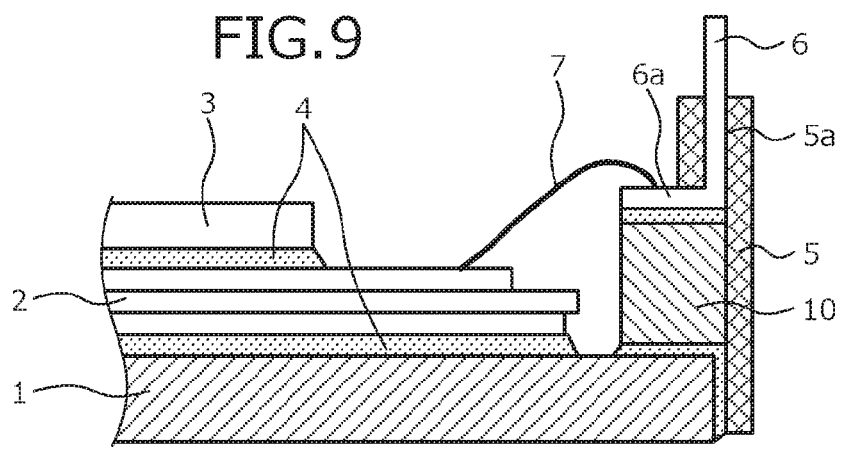

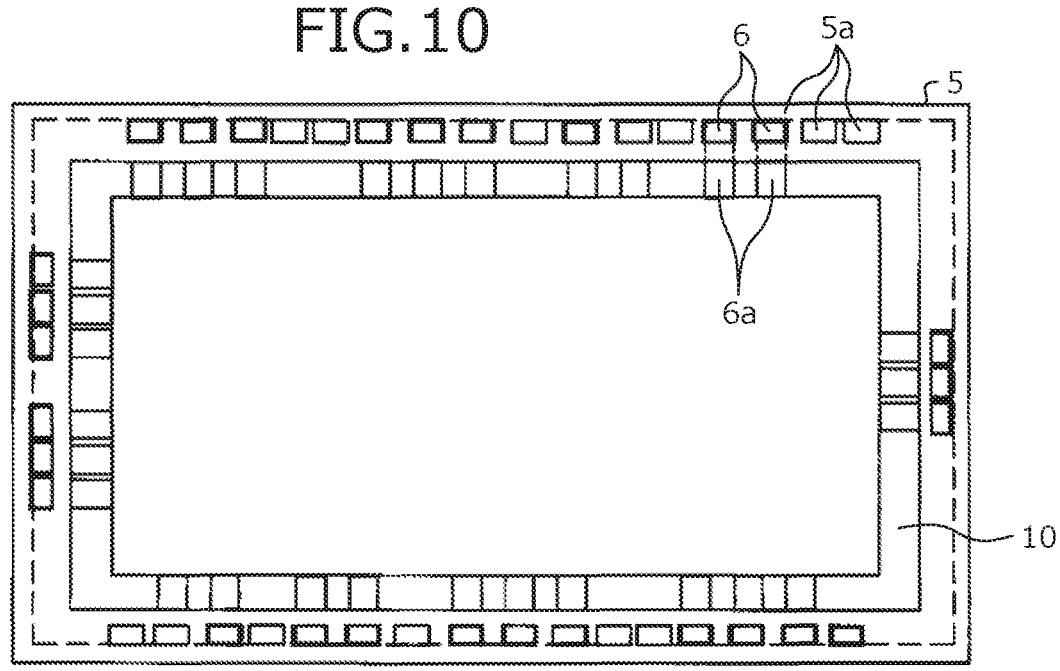

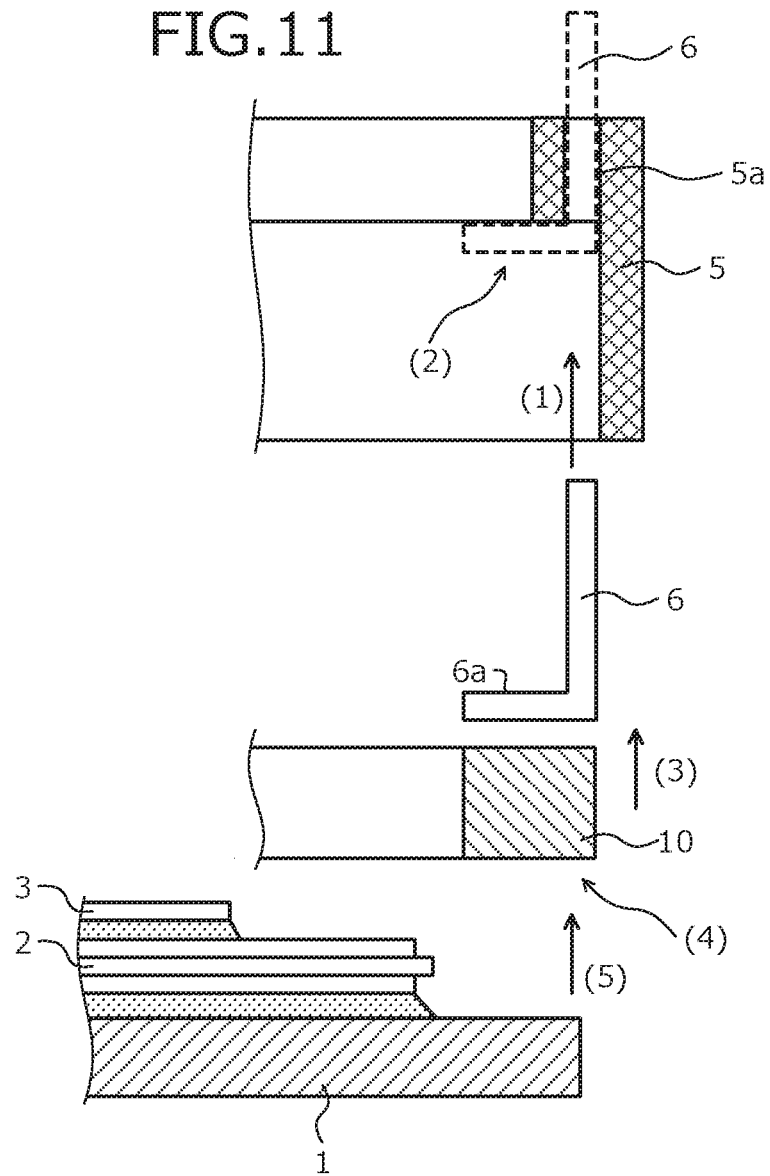

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2015-224140, filed on Nov. 16, 2015, the entire contents of which are incorporated herein by reference.

BACKGROUND OF THE INVENTION

1. Field of the Invention

The embodiments discussed herein are related to a semiconductor device and a method of manufacturing a semiconductor device.

2. Description of the Related Art

FIG. 9 is a package assembly structure view of a conventional semiconductor device. In FIG. 9, a package of a semiconductor device has a heat dissipation metal base 1 made of a copper material, an insulating circuit substrate 2 having a circuit pattern formed on an insulating substrate surface, and a semiconductor chip 3 (e.g., insulated gate bipolar transistor (IGBT)) mounted on the insulating circuit substrate 2. The insulating circuit substrate 2 is an insulating substrate such as a ceramic substrate including conductive plates on a front surface and a back surface. The package of the semiconductor device also has solder bonding layers 4 bonding between the metal base 1 and the conductive plate on the back surface of the insulating circuit substrate 2 as well as between the conductive plate on the front surface of the insulating circuit substrate 2 and the semiconductor chip 3, a resin case 5, and an external terminal 6 (main terminal, control terminal) mounted in a terminal attachment hole 5a in a peripheral wall portion of the resin case 5. The package of the semiconductor device also has a bonding wire 7 (aluminum wire) connecting an L-shaped leg portion 6a of the external terminal 6, protruding from the external terminal 6 to the inside of the resin case 5 and the conductive plate of the insulating circuit substrate 2, and a terminal pressing frame 10. The L-shaped leg portion 6a is a portion of the L-shaped external terminal 6 disposed within the resin case 5 to protrude inside the resin case 5.

The package assembly structure of FIG. 9 has the terminal pressing frame 10 so as to electrically insulate and separate the L-shaped leg portion 6a of the external terminal 6 protruding inside the resin case 5 and the metal base 1 overlapped with the case bottom surface side from each other and to press and prevent the L-shaped leg portion 6a from moving from a fixed position. The frame-shaped terminal pressing frame 10 is made of an insulating material and fitted inside of the resin case 5 so that the terminal pressing frame 10 is interposed between a lower surface of the L-shaped leg portion 6a and the metal base 1.

The terminal pressing frame 10 is made of a resin material equivalent to the resin case 5 and, after the external terminal 6 is mounted to the resin case 5, the terminal pressing frame 10 is fitted to an inner periphery of the resin case 5, and the heat dissipation metal base 1 overlapped on the lower surface side of the resin case 5 and the terminal pressing frame 10 are fixed to each other by an adhesive (e.g., a silicone adhesive).

In the wiring structure of FIG. 9, an upper surface main electrode of the semiconductor chip 3 is connected via the circuit pattern of the insulating circuit substrate 2 through the bonding wire 7 wired to the external terminal 6; however, in another structure, the upper surface main electrode of the semiconductor chip 3 and the external terminal 6 may be connected directly through a wire.

FIG. 10 is a plane view of a package of a conventional semiconductor device. Arrangement positions of the external terminals 6 differ depending on the product model, specifications specified by a user, etc. Therefore, in an existing technique, terminal attachment holes 5a formed in a peripheral wall portion of the resin case 5 are assigned and formed in advance so as to cope with all the specifications (see, for example, Japanese Laid-Open Patent Publication Nos. 2008-235651 and 2008-252055). As a result, the resin case 5 can be utilized as a common component, which eliminates the need for preparing the resin case 5 for each product model or specification specified by a user.

When the external terminals 6 are mounted to the resin case 5 at arrangement positions specified for each model of the semiconductor device, the terminal attachment holes 5a corresponding to the model or specified specification are selected from a multiplicity of the terminal attachment holes 5a assigned and formed in advance in the peripheral wall portion of the resin case 5. The external terminals 6 are then mounted in the selected terminal attachment holes 5a.

FIG. 11 is an explanatory view of a package assembly procedure of a conventional semiconductor device. First, out of the terminal attachment holes 5a formed in a peripheral wall portion of the resin case 5, the external terminal 6 is inserted and mounted in the selected terminal attachment hole 5a from the bottom surface side of the resin case 5 as indicated by arrow (1).

Subsequently, as indicated by arrow (2), an adhesive is applied to the whole periphery of the peripheral wall portion of the resin case 5 and the L-shaped leg portion 6a of the external terminal 6. To ensure a wire bonding property, the adhesive is applied one by one to the L-shaped leg portions 6a of the external terminals 6 mounted in the terminal attachment holes 5a. Since the adhesive is applied to the entire periphery of the peripheral wall portion of the resin case 5, the adhesive ends up at the terminal attachment holes 5a of the resin case 5 without the inserted external terminals 6.

Subsequently, the terminal pressing frame 10 is fitted from the bottom surface side of the resin case 5 as indicated by an arrow (3) to press the external terminal 6 from the lower side.

Subsequently, an adhesive is applied to a bottom surface of the terminal pressing frame 10, the surface contacting the metal base 1. A substrate assembly assembled at a different step and made up of the metal base 1, the insulating circuit substrate 2, and the semiconductor chip 3 is attached to the bottom surface side of the resin case 5 as indicated by an arrow (5) and the adhesive is thermally cured. As a result, the adhesive fixes the L-shaped leg portion 6a of the external terminal 6 and the terminal pressing frame 10 to each other as well as a peripheral edge of the metal base 1 and the terminal pressing frame 10 to each other.

Subsequently, the bonding wire (aluminum wire) 7 is bonded between the L-shaped leg portion 6a of the external terminal 6 and a conductive pattern of the insulating circuit substrate 2 by an ultrasonic bonding method, and the inside of the resin case 5 is filled with a sealing resin (not depicted) and then covered by a case lid (not depicted) to complete a product.

SUMMARY OF THE INVENTION

According to one aspect of the invention, a semiconductor device includes a resin case having a peripheral wall portion disposed with a plurality of terminal attachment holes; an external terminal mounted in any of the plurality of terminal attachment holes and having an L-shaped leg portion protruding inside the resin case; a terminal pressing frame made of an insulating material and supporting the external terminal at a predetermined mounting position; and a metal base coupled to the terminal pressing frame by an adhesive and having an insulating circuit substrate on which a semiconductor chip is mounted. The semiconductor device has a first gap partially between the terminal pressing frame and the L-shaped leg portion. The semiconductor device has a second gap between the terminal pressing frame and an inside surface of the resin case. The first gap and the second gap are connected. The terminal pressing frame contacts a leading end of the L-shaped leg portion, the terminal pressing frame being coupled to the L-shaped leg portion by an adhesive of the first gap and coupled to the inside surface of the resin case by an adhesive of the second gap.

In the semiconductor device, the second gap has a greater distance from the inside surface of the resin case at a position closer to the external terminal than a position closer to the metal base.

In the semiconductor device, the terminal pressing frame has a protrusion contacting the L-shaped leg portion in the first gap.

In the semiconductor device, the plurality of terminal attachment holes is disposed to correspond with terminal arrangements that differ according to model, and the external terminal is mounted in any of the plurality of terminal attachment holes depending on the model.

In the semiconductor device, the terminal pressing frame contacts a root of the L-shaped leg portion, and the first gap and the second gap are separated.

According to another aspect of the invention, a method of manufacturing a semiconductor device including a resin case having a peripheral wall portion disposed with a plurality of terminal attachment holes, an external terminal having an L-shaped leg portion, a terminal pressing frame made of an insulating material and supporting the external terminal at a predetermined mounting position, and a metal base having an insulating circuit substrate on which a semiconductor chip is mounted, the semiconductor device having a first gap partially between the terminal pressing frame and the L-shaped leg portion, the semiconductor device having a second gap between the terminal pressing frame and an inside surface of the resin case, the first gap and the second gap being connected, the method including mounting the external terminal in any of the plurality of terminal attachment holes of the resin case with the L-shaped leg portion of the external terminal protruding inside the resign case; bonding the terminal pressing frame to the resin case so as to contact a leading end of the L-shaped leg portion; applying an adhesive to the terminal pressing frame; and pressure-bonding the metal base to the terminal pressing frame so as to inject the applied adhesive into the first gap and the second gap.

Objects, features, and advantages of the present invention are specifically set forth in or will become apparent from the following detailed description of the invention when read in conjunction with the accompanying drawings.

BRIEF DESCRIPTION OF THE DRAWINGS

FIGS. 1 and 2 are cross-sectional views of a main portion of a package assembly structure of a semiconductor device according to a first embodiment;

FIG. 3 is a plane view of a terminal pressing frame of the semiconductor device according to the first embodiment;

FIG. 4 is an explanatory view of a package assembly procedure of the semiconductor device according to the first embodiment;

FIG. 7 is a cross-sectional view of a main portion of a package assembly structure of a semiconductor device according to a second embodiment;

FIG. 8 is an explanatory view of a package assembly procedure of the semiconductor device according to the second embodiment;

FIG. 9 is a package assembly structure view of a conventional semiconductor device;

FIG. 10 is a plane view of a package of a conventional semiconductor device; and FIG. 11 is an explanatory view of a package assembly procedure of a conventional semiconductor device.

DETAILED DESCRIPTION OF THE INVENTION

Figure 5A:
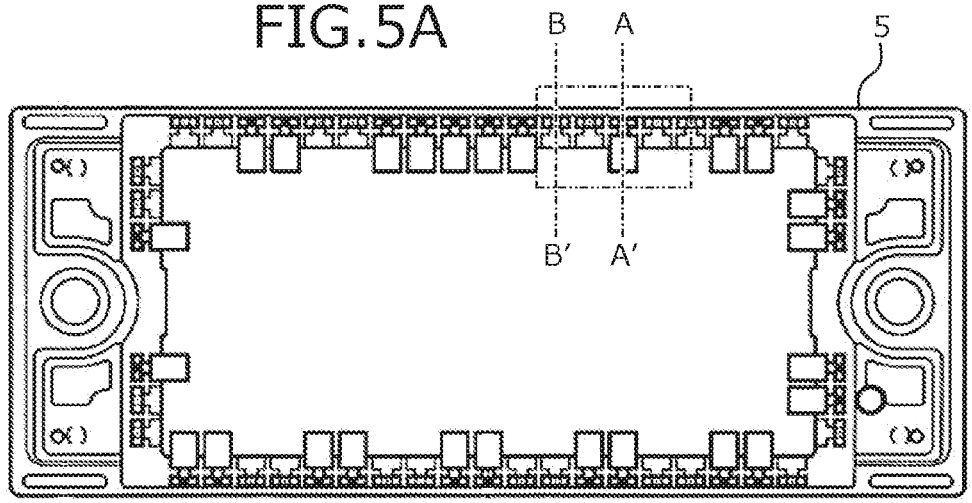
FIG. 5A is a planar view of a resin case.

Preferred embodiments of a semiconductor device and a method of manufacturing a semiconductor device according to the present invention will be described in detail with reference to the accompanying drawings. FIGS. 1 to 6 are configuration diagrams of a semiconductor device corresponding to a first embodiment of the present invention; FIGS. 7 and 8 are configuration diagrams corresponding to a second embodiment; and with respect to FIGS. 7 and 8, members corresponding to those in FIGS. 1 to 5 are denoted by the same reference numerals and are not be described in detail.

FIGS. 1 and 2 are cross-sectional views of a main portion of a package assembly structure of a semiconductor device according to a first embodiment. FIG. 1 is a cross-sectional view taken along a cutting line A-A' of FIG. 5A described later, and FIG. 2 is a cross-sectional view taken along a cutting line B-B' of FIG. 5A described later. Similar to a package of a conventional semiconductor device, a package of the semiconductor device according to the first embodiment has, for example, a heat dissipation metal base 1 made of a copper material and an insulating circuit substrate 2 (not depicted) having conductive plates laminated on a front surface and a back surface of an insulating substrate. The package of the semiconductor device also has a semiconductor chip 3 (not depicted) mounted on the insulating circuit substrate 2, solder bonding layers 4 (not depicted) bonding between the metal base 1 and the conductive plate on the back surface of the insulating circuit substrate 2 as well as between the conductive plate on the front surface of the insulating circuit substrate 2 and the semiconductor chip 3, a resin case 5, and an external terminal 6 mounted in a terminal attachment hole 5a in a peripheral wall portion of the resin case 5. The package of the semiconductor device also has a bonding wire 7 (not depicted) connected between an L-shaped leg portion 6a of the external terminal 6 and the conductive plate of the insulating circuit substrate 2, and a frame-shaped terminal pressing frame 10 made of an insulating material, inside the resin case 5. The L-shaped leg portion 6a is a portion of the L-shaped external terminal 6 disposed within the resin case 5 to protrude inside the resin case 5 as depicted in FIG. 1 etc. FIGS. 1 and 2 depict only the heat dissipation metal base 1, the resin case 5, the external terminal 6, and the terminal pressing frame 10 so as to clarify a difference from the package of the conventional semiconductor device. The conductive plate on the back surface of the insulating circuit substrate 2 may be increased in thickness in place of the metal base 1. In this case, the metal base 1 may be replaced with the insulating circuit substrate.

The package assembly structure of the semiconductor device according to the first embodiment differs from the package assembly structure of the conventional semiconductor device on the following points. In the package assembly structure of the conventional semiconductor device, the terminal pressing frame 10 is in close contact with a bottom surface of the L-shaped leg portion 6a of the external terminal 6 and is fitted without a gap from an inside surface of the resin case 5. On the other hand, as depicted in FIGS. 1 and 2, in the package assembly structure of the semiconductor device according to the first embodiment, the terminal pressing frame 10 has a structure forming a first gap 11 from the bottom surface of the L-shaped leg portion 6a of the external terminal 6 and a second gap 12 from the inside surface of the resin case 5. In FIGS. 1 and 2, dotted lines are drawn so as to clearly indicate boundaries with the first gap 11 and the second gap 12.

The L-shaped leg portion 6a of the external terminal 6 and the terminal pressing frame 10 are fixed to each other by filling the first gap 11 with an adhesive 15. The resin case 5 and the terminal pressing frame 10 are fixed to each other by filling the second gap 12 with the adhesive 15. For example, the adhesive 15 may have a viscosity of a range of 100 to 200 Pa·s. A viscosity of this viscosity range enables uniform spreading of the adhesive to the first gap 11, the second gap 12, etc. and suppresses the occurrence of voids in the first gap 11, the second gap 12, etc. A silicone resin, an epoxy resin, an acrylic resin, or a urethane resin may be used as the adhesive.

The bottom surface of the L-shaped leg portion 6a of the external terminal 6 is a surface of the external terminal 6, facing toward the terminal pressing frame 10. The inside surface of the resin case 5 is a surface within the resin case 5 indicated by arrow C in FIGS. 1 and 2.

The first gap 11 and the second gap 12 are connected. Connection means that the gaps are connected to each other to form one gap. Therefore, when the adhesive 15 is injected into the second gap 12, the adhesive 15 is injected also into the first gap 11. Additionally, the terminal pressing frame 10 has a contact portion 13 contacting a surface facing the terminal pressing frame 10 at a leading end 19 of the L-shaped leg portion 6a of the external terminal 6. The leading end 19 of the L-shaped leg portion 6a is the endmost portion in the portion of the L-shaped leg portion 6a inside the resin case 5.

The second gap 12 may have a greater distance from the inside surface of the resin case 5 at a position closer to the external terminal 6 than a position closer to the metal base 1. For example, a length of the terminal pressing frame 10 is made shorter on the external terminal 6 side than a length on the heat dissipation metal base 1 side to slope the terminal pressing frame 10 at an end facing the resin case 5. As a result, the distance from the inside surface of the resin case 5 may be made greater at a position closer to the external terminal 6 than a position closer to the metal base 1. Therefore, the adhesive 15 spreading to the second gap 12 may easily spread to the first gap 11.

When the first gap 11 and the second gap 12 are wider, the adhesive 15 may spread more easily; however, the amount of adhesive necessary for fixing the L-shaped leg portion 6a of the external terminal 6 and the resin case 5 increases. If the amount of adhesive increases, the mechanical strength of a module may decrease. Therefore, the first gap 11 and the second gap 12 may be about 1 mm to 2 mm, for example.

As depicted in FIG. 1, the terminal pressing frame 10 may have a protrusion 16 contacting the bottom surface of the L-shaped leg portion 6a of the external terminal 6 in the first gap 11. This increases a contact area between the terminal pressing frame 10 and the L-shaped leg portion 6a of the external terminal 6. The protrusion 16 has an effect of vertically positioning the external terminal 6.

FIG. 3 is a plane view of the terminal pressing frame 10 of the semiconductor device according to the first embodiment. As depicted in FIG. 3, the terminal pressing frame 10 may have on an outer peripheral surface, protrusions 17 fitted inside the resin case 5 for the adjustment of fitting and the positioning to the resin case 5. In this case, the resin case 5 may have a groove portion fitted to the protrusions 17. As a result, when the terminal pressing frame 10 is fitted inside the resin case 5, the terminal pressing frame 10 may be positioned easily, and the terminal pressing frame 10 may be supported without wobble since the protrusions 17 are fitted into the groove portion of the resin case 5.

As depicted in FIG. 1, the package assembly structure of the semiconductor device according to the first embodiment has the first gap 11 and the second gap 12 connected to each other and has the contact portion 13 contacting the leading end 19 of the L-shaped leg portion 6a of the external terminal 6 when the external terminal 6 is mounted in the terminal attachment hole 5a.

FIG. 1 is a cross-sectional view of the package assembly structure of the semiconductor device according to the first embodiment when the external terminal 6 is mounted in the terminal attachment hole 5a. The adhesive 15 applied to a lower portion of the terminal pressing frame 10 spreads to the first gap 11 and the second gap 12 so that the adhesive 15 in the second gap 12 fixes the terminal pressing frame 10 to the resin case 5 while the adhesive 15 in the first gap 11 fixes the terminal pressing frame 10 to the external terminal 6. The adhesive 15 spreads also to a gap 18 between the external terminal 6 and the resin case 5 and the adhesive 15 fixes the external terminal 6 to the resin case 5. As a result, the wobble of the external terminal 6 mounted in the terminal attachment hole 5a of the resin case 5 is reduced.

FIG. 2 is a cross-sectional view of the package assembly structure of the semiconductor device according to the first embodiment when the external terminal 6 is not mounted in the terminal attachment hole 5a. The adhesive 15 applied to the lower portion of the terminal pressing frame 10 spreads to the terminal attachment hole 5a and the second gap 12 so that the adhesive 15 in the second gap 12 fixes the terminal pressing frame 10 to the resin case 5 while the adhesive 15 spreading into the terminal attachment hole 5a fills the terminal attachment hole 5a. As a result, a sealing resin filling the inside of the resin case 5 can be prevented from climbing up from the terminal attachment hole 5a without the external terminal 6 mounted.

FIG. 4 is an explanatory view of a package assembly procedure of the semiconductor device according to the first embodiment. In the assembly procedure, first, among the terminal attachment holes 5a formed in a peripheral wall portion of the resin case 5, the external terminal 6 is inserted and mounted in the terminal attachment hole 5a corresponding to a predetermined terminal arrangement, from the bottom surface side of the resin case 5 as indicated by arrow (1). The external terminal 6 is mounted such that the L-shaped leg portion protrudes inside the resin case.

Figure 5B:
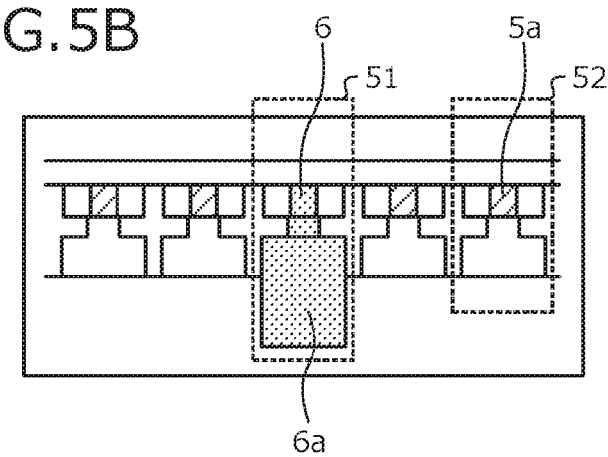
FIG. 5B is an enlarged view of a portion of the resin case.

FIG. 5A is a planar view of the resin case 5 of the semiconductor device according to the first embodiment after the external terminals 6 are inserted in the selected terminal attachment holes 5a. FIG. 5B is an enlarged view of a portion of the resin case indicated by a chained rectangle in FIG. 5A. A position of the inserted external terminal 6 is a position surrounded by a dotted rectangle 51, and the terminal attachment hole 5a is closed by inserting the external terminal 6. A position without the inserted external terminal 6 is a position surrounded by a dotted rectangle 52, and the terminal attachment hole 5a is left opened. FIG. 1 depicts a cross-sectional structure along a cutting line A-A' of FIG. 5A, and FIG. 2 depicts a cross-sectional structure along a cutting line B-B' of FIG. 5A.

Figure 6:
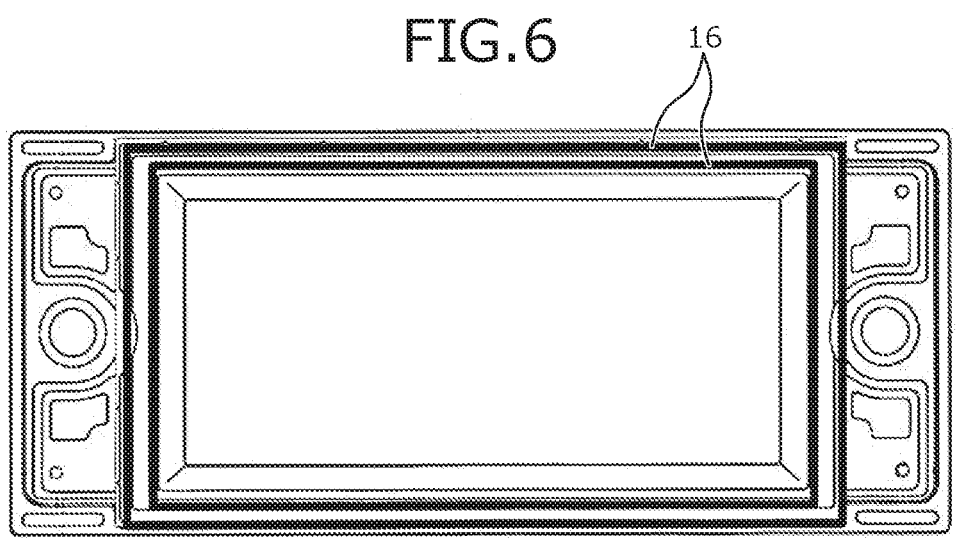
FIG. 6 is a planar view of the resin case 5 of the semiconductor device according to the first embodiment when the terminal pressing frame is inserted.

Subsequently, the terminal pressing frame 10 is fitted from the bottom surface side of the resin case 5 as indicated by arrow (2) to press the external terminal 6 from the lower side. FIG. 6 is a planar view of the resin case 5 of the semiconductor device according to the first embodiment when the terminal pressing frame 10 is inserted. An adhesive (not depicted) is then applied to a surface indicted by arrow (3), contacting the metal base 1 on a bottom surface of the terminal pressing frame 10. For example, the adhesive is applied to a portion 16 of black lines of FIG. 6 where the bottom surface of the terminal pressing frame 10 contacts the metal base 1.

Subsequently, a substrate assembly assembled at a different step made up of the metal base 1, the insulating circuit substrate 2, and the semiconductor chip 3 is attached to the bottom surface side of the resin case 5 as indicated by arrow (4). The pressure at the time of assembly of the metal base 1 causes the applied adhesive to spread to the second gap 12 and to further spread to the first gap 11 connected to the second gap 12. When the external terminal 6 is mounted in the terminal attachment hole 5a, the adhesive spreads also to a gap between the external terminal 6 and the resin case 5. The adhesive spreads also to the terminal attachment holes 5a without mounted external terminals 6 among the terminal attachment holes 5a. A silicon resin, an epoxy resin, an acrylic resin, or a urethane resin may be used for the adhesive.

Subsequently, the adhesive is thermally cured to fix a peripheral edge of the metal base 1 and the terminal pressing frame 10 to each other, the terminal pressing frame 10 and the resin case 5 to each other, and the terminal pressing frame 10 and the external terminal 6 to each other at the same time. The external terminal 6 and the resin case 5 are also fixed to each other.

Subsequently, similar to the conventional technique, the steps of bonding of a bonding wire (not depicted) to covering by a case lid (not depicted) are performed sequentially, and the package structure of the semiconductor device is completed.

As described above, according to the first embodiment, the first gap is present between the terminal pressing frame and the L-shaped leg portion of the external terminal, and the second gap is present between the terminal pressing frame and the resin case. Therefore, the adhesive applied to a surface contacting the metal base on the bottom surface of the terminal pressing frame spreads to the second gap due to the pressure when the metal base is fitted. Since the first gap and the second gap are connected, the adhesive spreading to the second gap further spreads to the first gap.

As a result, the adhesive fixes the terminal pressing frame and the L-shaped leg portion of the external terminal to each other, the terminal pressing frame and the resin case to each other, and the terminal pressing frame and the metal base to each other. Since the terminal pressing frame is fixed in three directions, i.e., the direction from the L-shaped leg portion of the external terminal to the terminal pressing frame, the direction from the resin case to the terminal pressing frame, and the direction from the metal base to the terminal pressing frame, the package structure of the semiconductor device of the present invention is improved in strength as compared to the package structure of the conventional semiconductor device fixed in two directions, i.e., the direction from the L-shaped leg portion of the external terminal to the terminal pressing frame and the direction from the metal base to the terminal pressing frame. Additionally, the adhesive spreading in the first gap is located on the back surface of the position to which the wire is connected by wire bonding on the leg portion of the external terminal. Therefore, when the wire is ultrasonic-bonded to the leg portion of the external terminal, ultrasonic vibrations may be applied efficiently from a bonding tool to a wire boding portion to ensure a highly reliable bonding strength. The wire bonding property is further improved by coupling and fixing the leg portion of the external terminal and the terminal pressing frame to each other by the adhesive so as to prevent the L-shaped leg portion from moving from the fixed position.

As described above, the first embodiment uses the terminal pressing frame forming gaps between the terminal pressing frame and the L-shaped leg portion of the external terminal as well as between the terminal pressing frame and the resin case. As a result, the adhesive applied to the bottom surface of the terminal pressing frame may be injected between the terminal pressing frame and the L-shaped leg portion of the external terminal as well as between the terminal pressing frame and the resin case. This enables the adhesive applied to the bottom surface of the terminal pressing frame to fix the L-shaped leg portion of the external terminal and the terminal pressing frame to each other. Therefore, the step of applying the adhesive to fix the L-shaped leg portion of the external terminal and the terminal pressing frame to each other may be eliminated. Since one of the steps of applying the adhesive may be eliminated in this way, the method of manufacturing a semiconductor device of the present invention may reduce the assembly cost of the semiconductor device. Moreover, the step of applying the adhesive one by one to the L-shaped leg portions of the external terminals may be eliminated. Since the time consumed for applying the adhesive one by one to the L-shaped leg portions of the external terminals may be reduced, the assembly time of the semiconductor device may be reduced.

The second gap has a larger distance from the inside surface of the resin case at a position closer to the external terminal than a position closer to the metal base. As a result, the adhesive spreading to the second gap may spread easily to the first gap. Therefore, the first gap may be filled more reliably with the adhesive, and the terminal pressing frame and the L-shaped leg portion of the external terminal may be fixed more reliably to each other.

The multiple terminal attachment holes are disposed to cope with terminal arrangements that differ according to model, and the external terminals are fitted into any of the multiple terminal attachment holes depending on the model. As a result, the resin case may be utilized as a component common to the models, thereby eliminating the need for producing a resin case for each model according to specifications of the model. Therefore, the costs required for design, production, and management of molds of the resin cases may be curtailed to achieve a significant reduction in production cost.

Since the method of manufacturing of the first embodiment is implemented by eliminating the step of applying the adhesive one by one to the L-shaped leg portions of the external terminals from the conventional method of manufacturing, a manufacturing apparatus used in the conventional method of manufacturing may be used for manufacturing, and no new capital investment is required.

FIG. 7 is a cross-sectional view of a main portion of a package assembly structure of a semiconductor device according to the second embodiment. The package assembly structure of the semiconductor device according to the second embodiment differs in the structure of the terminal pressing frame 10 from the package assembly structure of the semiconductor device according to the first embodiment.

The terminal pressing frame 10 has a structure forming a first gap 14 partially from the bottom surface of the L-shaped leg portion 6a of the external terminal 6 and the second gap 12 from the inside surface of the resin case 5. Unlike the first embodiment, the first gap 14 and the second gap 12 are not connected and are separated. A plane of the first gap 14 closer to the resin case 5 is defined by the terminal pressing frame 10, and the first gap 14 is separated from the second gap 12 by the terminal pressing frame 10. The first gap 14 is present as a recess in an upper surface of the terminal pressing frame 10. The upper surface of the terminal pressing frame 10 is the surface of the terminal pressing frame 10 facing toward the L-shaped leg portion 6a of the external terminal 6.

The L-shaped leg portion 6a of the external terminal 6 and the terminal pressing frame 10 are fixed to each other by filling the first gap 14 with the adhesive 15. The resin case 5 and the terminal pressing frame 10 are fixed to each other by filling the second gap 12 with the adhesive 15.

Since the first gap 14 and the second gap 12 are not connected, the terminal pressing frame 10 contacts a root of the L-shaped leg portion 6a of the external terminal 6. The root of the L-shaped leg portion 6a is a portion of the L-shaped leg portion 6a closer to the inner surface of the resin case 5. FIG. 7 is a cross-sectional view of the package assembly structure of the semiconductor device according to the second embodiment when the external terminal 6 is mounted in the terminal attachment hole 5a. A cross-sectional view in the case without the external terminal 6 mounted in the terminal attachment hole 5a is the same as the figure acquired by changing the terminal pressing frame 10 of the first embodiment to the terminal pressing frame 10 of the second embodiment and therefore is omitted.

FIG. 8 is an explanatory view of a package assembly procedure of the semiconductor device according to the second embodiment. In the assembly procedure, first, similar to the first embodiment, the step of mounting the external terminal 6 is performed.

Subsequently, an adhesive (not depicted) is applied to the first gap 14 of the terminal pressing frame 10 indicated by an arrow (2).

Subsequently, similar to the first embodiment, the terminal pressing frame 10 is fitted in from the bottom surface side of the resin case 5 as indicated by arrow (3) to press the external terminal 6 from the lower side. The pressure when the terminal pressing frame 10 is pressed causes the applied adhesive to fix the terminal pressing frame 10 and the external terminal 6 to each other.

Subsequently, similar to the first embodiment, a substrate assembly made up of the metal base 1, the insulating circuit substrate 2, and the semiconductor chip 3 is attached to the bottom surface side of the resin case 5 as indicated by arrow (5). The pressure at the time of assembly of the metal base 1 causes the adhesive to spread to the second gap 12. Since the first gap 14 is not connected to the second gap 12 unlike the first embodiment, the adhesive does not spread thereto.

Subsequently, similar to the first embodiment, the steps of thermally curing to covering by a case lid (not depicted) are performed sequentially, and the package structure of the semiconductor device is completed.

As described above, according to the second embodiment, the adhesive is applied to the first gap so that the L-shaped leg portion of the external terminal and the terminal pressing frame may be fixed to each other by the adhesive. Therefore, the step of applying the adhesive one by one to the L-shaped leg portions of the external terminals can be eliminated. Since the time consumed for applying the adhesive one by one to the L-shaped leg portions of the external terminals may be reduced and the assembly time of the semiconductor device may be reduced.

The terminal pressing frame contacts the root of the L-shaped leg portion. As a result, the terminal pressing frame may stably support the L-shaped leg portion of the external terminal.

However, in the package structure of the conventional semiconductor device, the adhesive is applied to the entire periphery of the peripheral wall portion of the resin case 5 and the L-shaped leg portion 6a of the external terminal 6, and the adhesive is applied to the surface of the resin case 5 contacting the metal base 1. Therefore, a large number of steps of applying the adhesive is included and the assembly cost of the semiconductor device cannot be reduced.

Additionally, in the package structure of the conventional semiconductor device, the adhesive is applied one by one to the L-shaped leg portions 6a of the external terminals 6. Since the multiple external terminals 6 are inserted in the package structure of the semiconductor device, a time is taken for applying the adhesive and the assembly time of the semiconductor device cannot be reduced.

Moreover, in the package structure of the conventional semiconductor device, the terminal pressing frame 10 and the resin case 5 are not fixed to each other by an adhesive. Therefore, the package structure of the semiconductor device may be insufficient in strength.

According to the present invention, the first gap is present between the terminal pressing frame and the L-shaped leg portion of the external terminal, and the second gap is present between the terminal pressing frame and the resin case. Therefore, the adhesive applied to the bottom surface of the terminal pressing frame contacting the metal base spreads to the second gap due to the pressure when the metal base is pressure bonded. Since the first gap and the second gap are connected, the adhesive that spreads to the second gap further spreads to the first gap.

As a result, the adhesive fixes the terminal pressing frame and the L-shaped leg portion of the external terminal to each other, the terminal pressing frame and the resin case to each other, and the terminal pressing frame and the metal base to each other. Since the terminal pressing frame is fixed in three directions, the semiconductor device of the present invention is improved in strength as compared to the package structure of the conventional semiconductor device fixed in two directions.

Since the terminal pressing frame contacts the leading end of the L-shaped leg portion, the terminal pressing frame may support the L-shaped leg portion. As a result, the external terminal may be supported at a predetermined position without wobble.

The adhesive applied to the bottom surface of the terminal pressing frame may fix the L-shaped leg portion of the external terminal and the terminal pressing frame to each other. Therefore, the step of applying the adhesive to fix the L-shaped leg portion of the external terminal and the terminal pressing frame to each other may be eliminated. Since one of the steps of applying the adhesive may be eliminated in this way, the method of manufacturing a semiconductor device of the present invention may reduce the assembly cost of the semiconductor device. Moreover, the step of applying the adhesive one by one to the L-shaped leg portions of the external terminals may be eliminated. Since the time consumed for applying the adhesive one by one to the L-shaped leg portions of the external terminals may be reduced, the assembly time of the semiconductor device may be reduced.

The second gap has a larger distance from the inside surface of the resin case at a position closer to the external terminal than a position closer to the metal base. As a result, the adhesive spreading to the second gap may easily spread to the first gap. Therefore, the first gap may be filled more reliably with the adhesive, and the terminal pressing frame and the L-shaped leg portion of the external terminal may be fixed to each other more reliably.

The terminal pressing frame may have a protrusion contacting the bottom surface of the L-shaped leg portion of the external terminal in the first gap. This increases the contact area between the terminal pressing frame and the L-shaped leg portion of the external terminal and therefore, the terminal pressing frame may stably support the L-shaped leg portion of the external terminal.

The multiple terminal attachment holes are disposed to cope with terminal arrangements that differ according to model, and the external terminals are fitted into any of the multiple terminal attachment holes depending on the model. As a result, the resin case may be utilized as a component common to the models, thereby eliminating the need to produce a resin case for each model, specific to the specifications of the model. Therefore, the costs required for design, production, and management of molds of the resin cases may be curtailed to achieve a significant reduction in production cost.

The terminal pressing frame has the second gap present between the L-shaped leg portion of the external terminal and the terminal pressing frame without connection to the first gap, and the adhesive applied to the entire periphery of the peripheral wall portion of the resin case spreads to the first gap due to the pressure when the terminal pressing frame is pressed. The adhesive spreading to the first gap may fix the L-shaped leg portion of the external terminal and the terminal pressing frame to each other. Therefore, the step of applying the adhesive one by one to the L-shaped leg portions of the external terminals may be eliminated. Since the time consumed for applying the adhesive one by one to the L-shaped leg portions of the external terminals may be reduced, the assembly time of the semiconductor device may be reduced.

The terminal pressing frame contacts the root of the L-shaped leg portion. As a result, the terminal pressing frame may stably support the L-shaped leg portion of the external terminal.

The semiconductor device and the method of manufacturing the semiconductor device according to the present invention achieves an effect of enabling reduction of the assembly processes and assembly time of the package structure of the semiconductor device using a resin case as a common component and improved strength of the package structure of the semiconductor device.

As described above, the semiconductor device according to the present invention is connected at the external terminal to, for example, a printed board of an inverter device by a user at a delivery destination and is used as an intelligent power module for inverter control of a motor, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A semiconductor device comprising:
an external terminal;
a resin case having a peripheral wall portion including a plurality of terminal attachment holes each being configured to receive said external terminal, said external terminal being mounted in one of the terminal attachment holes, and having an L-shaped leg portion disposed inside the resin case;
a terminal pressing frame made of an insulating material and supporting the external terminal at a predetermined mounting position;
a semiconductor chip;
a metal base having an insulating circuit substrate on which the semiconductor chip is mounted; and
an adhesive coupling the terminal pressing frame to the metal base, wherein
the semiconductor device has a first gap between a portion of the terminal pressing frame and a portion of the L-shaped leg portion,
the semiconductor device has a second gap between the terminal pressing frame and an inside surface of the resin case,
the terminal pressing frame contacts a leading end of the L-shaped leg portion, the terminal pressing frame being coupled to the L-shaped leg portion by a first part of the adhesive, that is disposed in the first gap, and coupled to the inside surface of the resin case by a second part of the adhesive that is disposed in the second gap.

2. The semiconductor device according to claim 1, wherein
the second gap has an inner periphery spaced from the inside surface of the resin case, and
a distance to said inside surface from a first position on said inner periphery that is closer to the external terminal than to the metal case, is greater than a distance to said inside surface from a second position on said inner periphery that is closer to the metal base than to the external terminal.

3. The semiconductor device according to claim 1, wherein the terminal pressing frame has a protrusion contacting the L-shaped leg portion in the first gap.

4. The semiconductor device according to claim 1, wherein
the terminal attachment holes are disposed to correspond with possible terminal arrangements that differ according to respective product models of products within which the resin case is includable, and
the external terminal is mounted in one of the plurality of terminal attachment holes based upon one of the models.

5. The semiconductor device according to claim 1, wherein
the terminal pressing frame contacts a root of the L-shaped leg portion, and
the first gap and the second gap are separated from each other.

6. The semiconductor device according to claim 1, wherein the first gap and the second gap are connected to each other.

7. A method of manufacturing a semiconductor device including an external terminal, a resin case having a peripheral wall portion including a plurality of terminal attachment holes each configured to receive said external terminal, the external terminal being mounted in one of the terminal attachment holes, and having an L-shaped leg portion disposed inside the resin case, a terminal pressing frame made of an insulating material and for supporting the external terminal at a predetermined mounting position, and a metal base having an insulating circuit substrate on which a semiconductor chip is mounted, the semiconductor device having a first gap between a portion of the terminal pressing frame and a portion of the L-shaped leg portion, the semiconductor device having a second gap between the terminal pressing frame and an inside surface of the resin case, the first gap and the second gap being connected, the method comprising:
mounting the external terminal in the one of the terminal attachment holes of the resin case with the L-shaped leg portion of the external terminal disposed inside the resin case;
bonding the terminal pressing frame to the resin case so that the terminal pressing frame contacts a leading end of the L-shaped leg portion;
applying an adhesive to the terminal pressing frame; and
pressure-bonding the metal base to the terminal pressing frame so as to inject the applied adhesive into the first gap and the second gap.

* * * * *